United States Patent
McIntyre et al.

(10) Patent No.: US 9,548,585 B1
(45) Date of Patent: Jan. 17, 2017

(54) MULTI-POINT LASER IGNITION DEVICE

(71) Applicants: Dustin L. McIntyre, Washington, PA (US); Steven D. Woodruff, Morgantown, WV (US)

(72) Inventors: Dustin L. McIntyre, Washington, PA (US); Steven D. Woodruff, Morgantown, WV (US)

(73) Assignee: U.S. Department of Energy, Washington, DC (US)

( * ) Notice: Subject to any disclaimer, the term of this patent is extended or adjusted under 35 U.S.C. 154(b) by 26 days.

(21) Appl. No.: 14/800,959

(22) Filed: Jul. 16, 2015

(51) Int. Cl.
*H01S 3/23* (2006.01)
*H01S 3/0941* (2006.01)
*H01S 3/11* (2006.01)
*H01S 3/00* (2006.01)
*G02B 19/00* (2006.01)
*H01T 14/00* (2006.01)
*H01S 3/16* (2006.01)

(52) U.S. Cl.
CPC ......... *H01S 3/2383* (2013.01); *G02B 19/0009* (2013.01); *G02B 19/0047* (2013.01); *H01S 3/0071* (2013.01); *H01S 3/0941* (2013.01); *H01S 3/11* (2013.01); *H01S 3/1643* (2013.01); *H01T 14/00* (2013.01)

(58) Field of Classification Search
CPC .... H01S 3/2383; H01S 3/2391; H01S 3/0941; H01S 3/09415; H01S 3/11–3/1127; H01S 3/0071
See application file for complete search history.

(56) References Cited

U.S. PATENT DOCUMENTS

| | | | | | |
|---|---|---|---|---|---|
| 3,699,474 A | * | 10/1972 | Landry | ................. | H01S 3/2383 372/100 |
| 5,321,711 A | * | 6/1994 | Rapoport | .................. | H01S 3/07 372/20 |
| 5,488,619 A | * | 1/1996 | Injeyan | ................. | H01S 3/0627 372/11 |
| 5,982,802 A | * | 11/1999 | Thony | .................... | H01S 3/0627 372/50.124 |
| 6,362,919 B1 | * | 3/2002 | Flanders | .............. | G02B 6/4204 359/489.06 |

(Continued)

FOREIGN PATENT DOCUMENTS

JP WO 2012039123 A1 * 3/2012 .............. F02P 15/08

*Primary Examiner* — Joshua King
(74) *Attorney, Agent, or Firm* — Felisa L. Leisinger; Michael J. Dobbs; Brian J. Lally (57) ABSTRACT

A multi-point laser device comprising a plurality of optical pumping sources. Each optical pumping source is configured to create pumping excitation energy along a corresponding optical path directed through a high-reflectivity mirror and into substantially different locations within the laser media thereby producing atomic optical emissions at substantially different locations within the laser media and directed along a corresponding optical path of the optical pumping source. An output coupler and one or more output lenses are configured to produce a plurality of lasing events at substantially different times, locations or a combination thereof from the multiple atomic optical emissions produced at substantially different locations within the laser media. The laser media is a single continuous media, preferably grown on a single substrate.

20 Claims, 5 Drawing Sheets

(56) References Cited

U.S. PATENT DOCUMENTS

| | | | | |
|---|---|---|---|---|
| 6,724,787 B2* | 4/2004 | Masterson | ............ | H01S 3/0627 |
| | | | | 372/21 |
| 7,126,976 B2* | 10/2006 | Farahi | ................... | B82Y 10/00 |
| | | | | 372/69 |
| 7,330,493 B2* | 2/2008 | Luo | ........................ | H01S 3/005 |
| | | | | 372/50.1 |
| 7,535,937 B2* | 5/2009 | Luo | ...................... | G02F 1/3534 |
| | | | | 372/105 |
| 7,661,401 B2 | 2/2010 | Anezaki et al. | | |
| 7,765,980 B2 | 8/2010 | Vogel et al. | | |
| 8,127,732 B2 | 3/2012 | Kopecek et al. | | |
| 8,146,554 B2 | 4/2012 | Gruber | | |
| 8,594,147 B1* | 11/2013 | Burke | ..................... | F41A 19/63 |
| | | | | 372/34 |
| 2007/0280305 A1* | 12/2007 | Zucker | ................... | H01S 3/115 |
| | | | | 372/12 |
| 2008/0264371 A1 | 10/2008 | Taido et al. | | |
| 2009/0133655 A1 | 5/2009 | Inohara et al. | | |
| 2012/0131926 A1 | 5/2012 | Kopecek et al. | | |
| 2012/0131927 A1 | 5/2012 | Denis et al. | | |
| 2012/0243563 A1* | 9/2012 | Goldberg | ............. | H01S 3/0612 |
| | | | | 372/11 |
| 2012/0312267 A1 | 12/2012 | Ridderbusch | | |
| 2013/0000597 A1 | 1/2013 | Weinrotter et al. | | |

\* cited by examiner

MULTI-POINT LASER IGNITION DEVICE

GOVERNMENT INTERESTS

The United States Government has rights in this invention pursuant to the employer/employee relationship between the inventors and the U.S. Department of Energy, operators of the National Energy Technology Laboratory (NETL).

FIELD OF THE INVENTION

The present invention relates to a multi-point laser device capable of producing a plurality of lasing events at substantially different times, locations or a combination thereof using the same laser media and multiple optical pumping sources.

BACKGROUND OF THE INVENTION

The efficient operation of engines is essential for reducing transportation and energy costs, fuel consumption, and harmful emissions. The lean-burn operation of engines, where the production of NOx may be significantly reduced, is instrumental in efficient operation, however, incomplete mixing can lead to unnecessary misfire or incomplete burning when the ignition spark occurs and fails to ignite or fully ignite the mixture properly or not at all due to local mix heterogeneity. As every engine has a slightly different intake and fuel introduction design, manufactures are forced to keep lean operation closer to stoichiometry to stay away from the lean limit to avoid misfires. Therefore, there is a need in the art to alieve issues with misfires in a lean-burn engine.

SUMMARY OF THE INVENTION

Described herein is a multi-point laser device comprising a plurality of optical pumping sources, a high-reflectivity mirror, a laser media, a passive q-switch media, an output coupler, and one or more output lenses. Each optical pumping source having a corresponding optical path. The high-reflectivity mirror, the laser media, the output coupler, an output lens from the one or more output lenses are all positioned along each optical path. The passive q-switch is positioned along at least one optical path. The high-reflectivity mirror is positioned between and optically connected to each optical pumping source and the laser media along each optical path. The laser media is positioned between and optically connected to the high-reflectivity mirror and the output coupler media along each optical path. The passive q-switch media is positioned between and optically connected to the laser media and the output coupler along at least one optical path. The output coupler is positioned between and optically connected to the laser media and an output lens from the one or more output lenses along each optical path.

Each optical pumping source is configured to create a pumping excitation energy. The laser media is made of a material that emits an atomic optical emission when exposed to the pumping excitation energy. The high-reflectivity mirror is substantially reflective to the atomic optical emission of the laser media and substantially transparent to the pumping excitation energy. Each optical pumping source is configured to create pumping excitation energy along a corresponding optical path directed through the high-reflectivity mirror and into the laser media at substantially different locations within the laser media thereby producing atomic optical emissions at substantially different locations within the laser media and directed along its corresponding optical path of the optical pumping source. The output coupler and one or more output lenses are configured to produce a plurality of lasing events at substantially different times, locations or a combination thereof from the multiple atomic optical emissions produced at substantially different locations within the laser media. The laser media is a single continuous media having a single inseparable structure, preferably grown on a single substrate. Preferably, a control system is connected to and configured to control the plurality of optical pumping sources either in concert or individually.

DETAILED DESCRIPTION OF THE INVENTION

Figure 1:
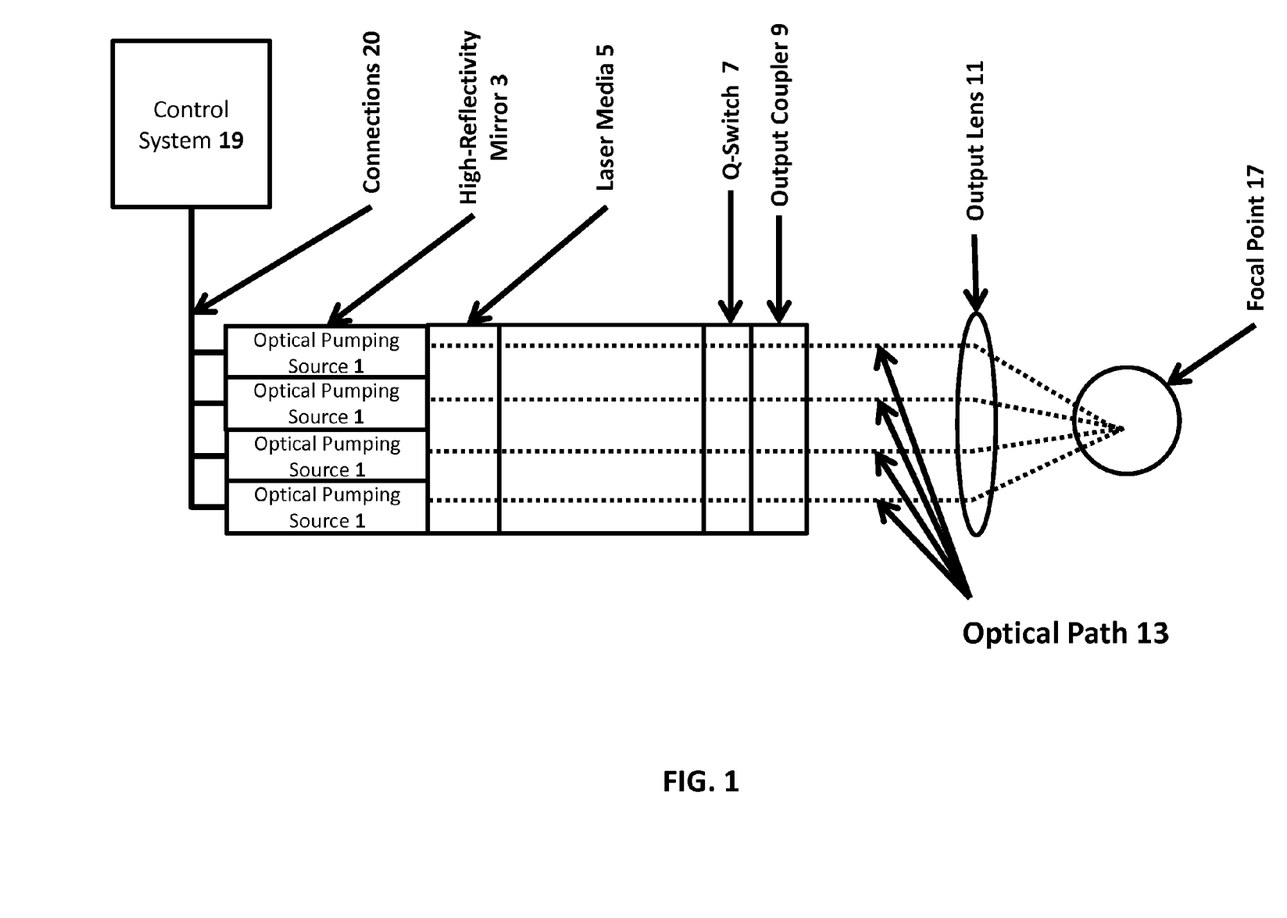
FIG. 1 depicts an overview of one embodiment of a multi-point laser device producing a plurality of lasing events at substantially different times and focused to substantially the same location using a single output lens.

FIG. 1 depicts an overview of one embodiment of a multi-point laser device producing a plurality of lasing events at substantially different times and focused to substantially the same location using a single output lens. As shown, a plurality of optical pumping sources 1, a high-reflectivity mirror 3, a laser media 5, a passive q-switch media 7, an output coupler 9 and one or more output lenses, which in this embodiment is a single output lens 11, are all positioned along an optical path 13 corresponding to each optical pumping source 1. Each optical pumping source 1 produces a pumping excitation energy, which substantially passes through the high-reflectivity mirror 3 and into the laser media 5 along its corresponding optical path 13. In response to the pumping excitation energy from the plurality of optical pumping sources 1, the laser media 5 is made of a material which emits atomic optical emissions in various directions, not necessarily along an optical path 13. The atomic optical emissions emanating from the laser media 5 towards the one or more optical sources 1 will be substantially reflected by the high-reflectivity mirror 3. The atomic optical emissions emanating from the laser media 5 reaching the passive q-switch media 7 will be absorbed by the passive q-switch media 7 until the passive q-switch media 7 becomes substantially transparent to the atomic optical emissions. Once the passive q-switch media 7 becomes substantially transparent to the atomic optical emissions, the atomic optical emissions is focused by the single output lens 11 along a corresponding optical path 13, preferably in a manner to produce one or more sparks. Preferably, the system is optimized to time the one or more sparks to pump and maintain a longer lasting spark, sparks, or a combination thereof. As described herein, the optical emissions may be designed to occur separately or in concert, as desired. A control system 19 is also preferably connected to and configured to control the plurality of optical pumping sources 1 via one or more connections 20.

The atomic optical emissions produced by excitation of the laser media 5 by pumping excitation energy from the plurality of pumping sources 1 will reflect back and forth between the high-reflectivity mirror 3, and either the output coupler 9 or the passive q-switch material 7 along a corresponding optical path 13. The atomic optical emissions will traverse the laser media 5 and interact with excited atoms, preferably Nd, within the laser media 5, inducing stimulated atomic optical emissions where the original photons from the atomic optical emissions cause the decay of an excited state at the same energy. The stimulated event produces light of the same wavelength (about 1,064 nm for a Nd:YAG laser media), phase, and in the same direction as the stimulating photon. At substantially the same time the passive q-switch media 7 allows a certain percentage of the incident photons to pass through unimpeded. The balance of the certain percentage of photons is absorbed within the passive q-switch media 7 inducing excited states. When the material of the passive q-switch media 7 is in an excited state it is substantially transparent to the atomic optical emission of the laser media 5. Therefore as more of the atomic optical emissions are absorbed it effectively makes the passive q-switch media 7 more and more transparent for a short time. This allows more atomic optical emissions to pass through and return producing more stimulated atomic optical emissions within the laser media 5.

This process of increasing the transparency of the passive q-switch media 7 allows a large number of excited states to build up within the laser media 5 until the passive Q switch media 7 reaches a threshold transparency. The passive q-switch media 7 begins to increase transparency exponentially and the number of photons, induced from the atomic optical emissions, within the laser cavity (high-reflectivity mirror 3, laser media 5, passive q-switch media 7, and output coupler 9) also grows exponentially. At this point, the passive q-switch media 7 is virtually clear of losses and large scale lasing occurs depleting the excited states in the laser media 5 within a few round trips. The lasing energy produced is a large number of photons in a very short time pulse width. The lasing energy is directed through the one or more output lenses, the single output lens 11 in the embodiment shown in FIG. 1. The single output lens 11 focuses the lasing energy into a focal point 17. In one embodiment, the single output lens 11 focuses the lasing energy down to a sufficiently small focal point 17, preferably generating a power density or photon flux density of about $1 \times 10^{11}$ W/cm$^2$ or greater so as to create a spark.

As used herein, the term "optically connected" shall refer to any means of optically transferring between either directly or through any number of intermediate components.

As used herein, the term "substantially transparent" shall refer to at least a transparency that is not normally present, unless the specifically designed for by one skilled in the art. More preferably, "substantially transparent" is a majority of the energy passing through. More preferably, "substantially transparent" allows, for example, at least 51%, 60%, 70%, 80%, 90%, 95% or 99% of the specified energy to pass through with preference given to the higher transmission percentages. As used herein, "substantially transparent" is only specific to the transmission of light, without regard to the alteration of that light, for example, phase and direction. Therefore, "substantially transparent" as used herein, shall also include translucent material. Transparent material is preferred, as described herein, as translucent material may cause light to deviate from a path along a corresponding optical path and away from the laser device.

As used herein, the term "substantially reflective" shall refer to at least a reflectivity that is not normally present, unless the specifically designed for by one skilled in the art. More preferably, "substantially reflective" is at least a majority of the energy reflecting. More preferably, "substantially reflective", for example, reflects at least 51%, 60%, 70%, 80%, 90%, 95% or 99% of the specified energy with preference given to the higher reflectivity percentages. As used herein, "substantially reflective" is only specific to the reflection of light, without regard to any other alteration of that light, for example, phase.

As used herein, the term "substantially different times" shall refer to at least a time difference that is not normally present, unless the specifically designed for by one skilled in the art. More preferably, "substantially different time" is, for example, at least a difference of 1 nanosecond, 10 nanoseconds, 100 nanoseconds, or 1,000 nanoseconds with preference given to the longer times.

As used herein, the term "substantially the same time" shall refer to a time closeness that is not normally present, unless the specifically designed for by one skilled in the art. More preferably, "substantially the same time" is, for example, no more than 10,000 microseconds, 1,000 microseconds, or 100 microseconds with preference given to the shorter times.

As used herein, the term "substantially different locations" shall refer to at least a distance that is not normally present, unless the specifically designed for by one skilled in the art. More preferably, "substantially different locations" is a separation, for example, a separation of at least 1 millimeter, 100 millimeter, or 1 centimeter, with preference given to the longer distance.

As used herein, the term "substantially the same location" shall refer to a closeness that is not normally present, unless the specifically designed for by one skilled in the art. More preferably, "substantially the same location" is, for example, no further than 1 centimeter, 100 millimeter, or 1 millimeter, with preference given to the shorter distance.

Optical Pumping Sources 1

Each optical pumping source 1 creates a pumping excitation energy having low peak power, preferably less than 1,000 peak Watts, more preferably about 100-1,000 Watts, depending on the material of the laser media 5. The pumping excitation energy needs to be sufficient enough to excite the laser media 5 at a greater rate than lost from subsequent stimulated atomic optical emissions and/or natural decay. The pumping excitation energy may be a single pulse, a continuous stream, or a series of pulses. In one embodiment, at least some of the plurality of optical pumping sources 1 is a laser diode providing optical pumping excitation energy in the form of a single square wave pulse having a low power, preferably less than 1,000 peak Watts and a time duration of tens to several hundred microseconds.

In a preferred embodiment, at least some of the plurality of optical pumping sources are one or more vertical-cavity surface-emitting lasers (VCSEL). In this embodiment, the VCSELs are configured in a planar array and are individually activated as needed to provide the required pumping excitation energy. The VCSELs are configured to emit light at a wavelength which excites the ions in the laser media 5, as described above. Preferably, each VCSEL emits ~100 milliwatts, whereby 1,000 VCSELs in a close packed array are activated to provide a 100 watt pumping excitation energy. The array of VCSELs preferably emits parallel beams. Preferably, one or more lenses are used to combine the beams from the VCSELs into a plurality of beams directed into the laser media 5, as described herein.

Each optical pumping source 1 is optically connected to the laser media 5 through the high-reflectivity mirror 3. Each optical pumping source 1 is positioned along a corresponding optical path 13 and produces a pumping excitation energy, which is directed to a substantially different location within the laser media 5.

In one embodiment, the optical pumping sources 1 are controlled by the control system 19 together in concert, whereby the pumping excitation is produced at the substantially the same time by each optical pumping source 1 and in concert without individual control. In an alternate embodiment, the plurality of optical pumping sources 1 is controlled by the control system 19 individually. Individually controlling each optical pumping source 1 may be preferable, for example, in embodiments whereby it is desired to produce multiple lasing events occurring at substantially different times. In one preferred embodiment, a high-energy lasing is followed later by one or more lower energy lasing events, which is preferably used to maintain a spark for a longer time for enhanced combustion in an engine. In a preferred embodiment, each optical pumping source 1 is configured to produce pumping excitation energy passing along parallel optical paths 13.

High-Reflectivity Mirror 3

The high-reflectivity mirror 3 is substantially reflective to the atomic optical emissions of the laser media 5. The high-reflectivity mirror 3 is substantially transparent to the pumping excitation energy. The high-reflectivity mirror 3 allows pumping excitation energy emitted from the plurality of optical pumping sources 1 in the coaxial pumping configuration to pass through, while reflecting the intracavity atomic optical emissions of the laser media 5. Preferably, the high-reflectivity mirror 3 comprises doped or undoped YAG, Co:doped YAG, fused silica, sapphire, or a combination thereof, preferably further comprising one or more thin film optical coatings deposited onto one face.

Preferably, the high-reflectivity mirror 3 is a substantially transparent optical media such as YAG, fused silica, or sapphire having a coating that is substantially reflective to the atomic optical emission of the laser media, and that is substantially transparent to the pumping excitation energy. More preferably, the high-reflectivity mirror 3 is fused silica having a coating that is substantially reflective to the atomic optical emission of the laser media, and that is substantially transparent to the pumping excitation energy. In one embodiment, the high-reflectivity mirror 3 comprises a plurality of coatings preferably made of Silicon, Titanium, Tantalum, Zirconium, Hafnium, Scandium, Niobium, oxides thereof, fluorides thereof or combinations thereof. More preferably, the coatings preferably comprise materials with various indices of refraction for example as $Al_2O_3$, $Ta_2O_5$, $SiO_2$, $TiO_2$, $CaF_2$, $ZrO_2$, $BeO_2$, $MgF_2$, $LaF_3$ and $AlF_3$ or combinations thereof.

In one embodiment, the high-reflectivity mirror 3 is deposited as an optical coating onto the face of the laser media 5. In another embodiment the high-reflectivity mirror 3 material has a large thickness where one side is bonded directly to the laser media 5 and the other side has the optical coating deposited directly on to it to define the optical cavity. By varying the thickness of the high-reflectivity mirror 3 material one can tune the length of the optical cavity thereby removing heat that the pumping excitation energy deposits into the face of the laser media 5. When the high-reflectivity mirror material has a significant thickness between the laser media 5 and the high reflectivity 3 optical coating, optical distortions caused by thermal lensing within the laser are reduced. The length of the cavity dictates the output pulsewidth and is preferably tuned to provide a pulsewidth that is most appropriate for a particular application.

Laser Media 5

The laser media 5 is made of a material that emits an atomic optical emission when exposed to the pumping excitation energy. The laser media 5 is preferably made of one of the materials described in Koechner, W., Bass, M., "Solid State Lasers: A Graduate Text" Springer, New York, 2003 hereby fully incorporated by reference. The laser media 5 is generally a host material that is doped. The host materials are preferably glasses, or crystals of oxides, garnets, vanadates, fluorides, or a combination thereof. The Glasses are preferably doped with Nd, Er, or Yb. Oxides such as sapphire are preferably doped with Ti. The Garnets are preferably Yttrium Aluminum Garnet Y3Al5O12 (YAG), Gadolinium Gallium Garnet $Gd_3Ga_5O_{12}$ (GGG), and Gadolinium Scandium Aluminum Garnet $Gd_3Sc_2Al_3O_{12}$ (GSGG) and are preferably doped with rare earths such as Nd, Tm, Er, Ho, Yb. The Vanadates or Yttrium Orthovanadate (YVO4) are preferably doped with Nd. The Fluorides or Yttrium Fluoride (YLiF4) are preferably doped with Nd. The laser media 5 is preferably Nd:YAG (neodymium doped yttrium aluminium garnet), Nd:Glass (neodymium-doped glass), Nd:YLF (neodymium doped yttrium lithium fluoride), Nd:YVO4 (Yttrium Vanadate), Er:Glass (Erbium doped glass), Yb:YAG (ytterbium doped yttrium aluminium garnet), Alexandrite, Ti:Sapphire (Titanium sapphire), or a combination thereof. In the preferred embodiment the laser media 5 is Nd:YAG having about 0.5% atomic weight of Nd, which will emit an atomic optical emission at about 1,064 nm. Preferably, one or more coatings are used to reduce optical, thermal or a combination thereof stresses in the laser media 5.

The dopant level of the laser media 5 is preferably low to improve performance. Lowering the dopant concentration affects the overall output by improving the beam overlap efficiency (side pumped), improving the penetration depth (end pumped), improving the absorption depth of the optical pumping excitation energy, reducing thermal lensing losses, and reducing losses due to ASE (Amplified Spontaneous Emission). This leads to a more uniform pumped gain profile as well as more uniformly distributed thermal stresses which lessen the effects of thermal lensing. The reduction of dopant concentration lowers the gain of the material slightly but offers larger energy storage capacity in return.

Preferably, the laser media 5 is grown together and coexists with the passive q-switch media 7 the laser media 5. In one such preferred embodiment, the laser media 5 comprises CR:YAG; Nd:YAG, or a combination thereof positioned between a first undoped YAG layer coating and a second undoped YAG layer coating along each optical path, thereby forming one uninterrupted material comprising the laser media 5 and the passive q-switch media 7 coexisting together.

Passive Q-Switch Media 7

The passive q-switch media 7 is made of a material with a variable attenuation, which is reduced after optical stimulation from the lasing energy. The passive q-switch media 7 preferably comprises Li:F or Cr:YAG. The passive q-switch media 7 preferably comprises Cr:YAG (chromium doped yttrium aluminum garnet), when the lasing species is Nd, having enough Cr such that the small signal transmission of the atomic optical emission is in the range of 10-60%. In a preferred embodiment, the laser media 5 is grown together with the passive q-switch media 7.

Output Coupler 9

The output coupler 9 is optically connected to the one or more output lenses, the single output lens 11 in FIG. 1, along the each optical path 13. The output coupler 9 substantially reflects the atomic optical emission of the laser media 5. Preferably, the output coupler 9 is fused silica, sapphire, undoped YAG, or a combination thereof, preferably further comprising a plurality of optical coatings deposited onto one face, preferably made of Silicon, Titanium, Tantalum, Zirconium, Hafnium, Scandium, Niobium, oxides thereof, fluorides thereof or combinations thereof. More preferably, the coatings preferably comprise materials with various indices of refraction for example as $Al_2O_3$, $Ta_2O_5$, $SiO_2$, $TiO_2$, $CaF_2$, $ZrO_2$, $BeO_2$, $MgF_2$, $LaF_3$ and $AlF_3$ or combinations thereof. In the alternative, the output coupler 9 is another optical glass that is substantially transparent to the atomic optical emission of the laser media 5, has a high optical damage threshold, and can receive an appropriate substantially reflective coating.

In one embodiment, the output coupler 9 is deposited as an optical coating onto the face of either the laser media 5 to define the optical cavity. In another embodiment the output coupler 9 material has a large thickness where one side is bonded directly to the laser media 5 and the other side has the optical coating deposited directly on to its opposing face to define the optical cavity. The thickness of the partially reflecting mirror material is preferably varied to tune the length of the optical cavity and/or to help remove heat that the pumping excitation energy deposits into the laser media 5. When the output coupler 9 material has a significant thickness it reduces optical distortions caused by thermal lensing within the laser. The output coupler 9 material preferably does not interact with either the pumping excitation energy or the atomic optical emissions of the laser media 5 and is preferably used as a heat transfer media to reduce heat concentrations within the laser media 5 or passive q-switch media 7. The length of the cavity dictates the output pulse width and is preferably tuned to provide a pulse width that is most appropriate for the particular application.

Output Lenses 11

The one or more output lenses 11, which in this embodiment is the single output lens 11, focuses the lasing energy produced by the laser cavity (high-reflectivity mirror 3, laser media 5, passive q-switch media 7, and output coupler 9). In the preferred embodiment, the one or more output lenses 11 are each a plano-convex or bi-convex lens, preferably having a focal length of about 1-5 centimeters. Preferably, the one or more output lenses 11 include fused silica, sapphire, undoped YAG, or some other material that is substantially transparent to the lasing energy, has an appropriate index of refraction, and has a high optical damage threshold. In another embodiment the one or more output lenses 11 include Bi-convex lens. In another embodiment the one or more output lenses 11 is a best form lens where each surface has a different radius of curvature selected to optimize the focal point size. In another embodiment the one or more output lenses 11 is a plano convex lens where the curved surface is aspherical designed to optimize the focal point size at the lasing wavelength. Preferably, the one or more output lenses 11 include anti-reflection coatings.

Figure 2:
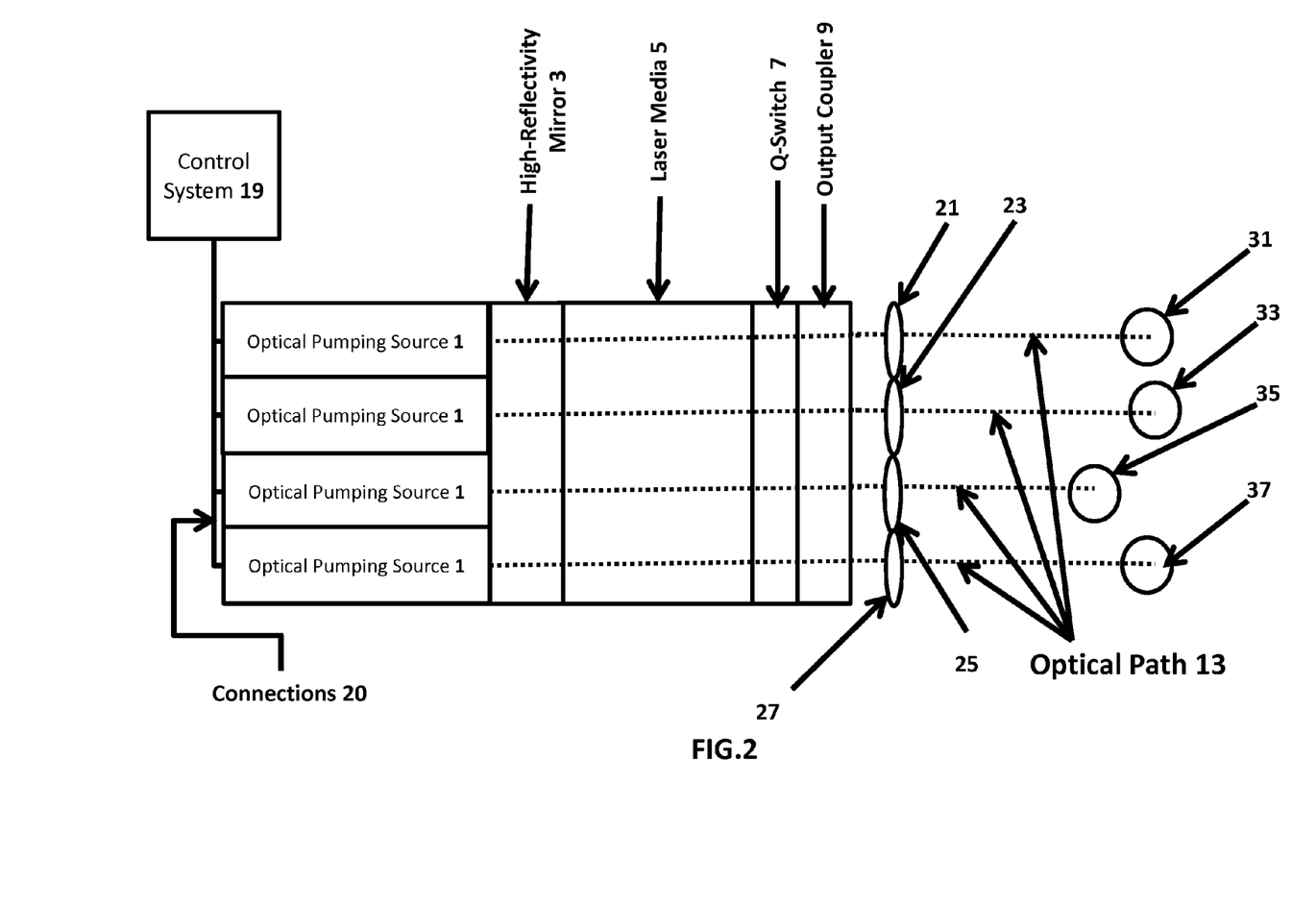
FIG. 2 depicts an overview of one embodiment of a multi-point laser device producing a plurality of lasing events focused to substantially different locations using a plurality of output lenses.

Any number of output lenses 11 may be used, include a single lens as shown in FIG. 1, a lens for each optical path as shown in FIG. 2, or a combination thereof. Furthermore, if desirable, one or more optical paths may pass through a plurality of output lenses 11.

Optical Path 13

Each optical path 13 represents the optical path of the pumping energy from a corresponding optical pumping source 1 to the laser media 5 and then the resulting lasing energy produced by the depletion of the excited states in the laser media 5 after the production of atomic optical emissions. As described herein, the resulting lasing energy produced by the depletion of the excited states in the laser media 5 passes at least through the output coupler 9, and then to an output lens from the one or more output lenses 11, a single output lens as depicted in FIG. 1. As known by one skilled in the art, the optical path does not include or depict the atomic optical emissions produced by the high-reflectivity mirror 3, the reflection of atomic optical emissions by the high-reflectivity mirror 3, or any absorption by, reflections off, or transmission through the q-switch 7.

Control System 19

The control system 19 is connected to and configured to control the plurality of optical pumping sources 1. Each optical pumping source 1 is connected to the control system 19 via one or more connections 20. The one or more connections 20 are any means of connecting the control system 19 to each optical pumping source 1 so that the control system 19 may control the plurality of optical pumping sources 1 as described herein. Preferably, the one or more connections 20 include, but are not limited to, wires, optical fibers, electronic, wires busses, wireless communications systems, and other means of communicating. In one embodiment, the control system 19 includes a power supply to power each optical pumping source 1 and is connected to supply power each optical pumping source 1, and thereby controls the plurality of optical pumping sources 1.

The control system 19 preferably comprises a processor, computer, application specific integrated controller (ASIC), microcontroller, CPU, or a combination thereof. In one embodiment the interlock control system is an AMEGA128 as sold by ATMEL CORPORATION.

FIG. 2

FIG. 2 depicts an overview of one embodiment of a multi-point laser device producing a plurality of lasing events focused to substantially different locations using a plurality of output lenses 21, instead of the single output lens as shown in FIG. 1 for the one or more output lenses. As shown in FIG. 2, and similar to FIG. 1, a high-reflectivity mirror 3, a laser media 5, a passive q-switch media 7, an output coupler 9 and an output lens from said one or more output lenses, which in this embodiment is a plurality of output lenses, a first output lens 21, a second output lens 23, a third output lens 25 and a fourth output lens 27, are positioned along an optical path 13 corresponding to each optical pumping sources 1. Therefore, each optical path 13 passes through one of the plurality of optical lenses (the first output lens 21, the second output lens 23, the third output lens 25 and the fourth output lens 27).

Each optical pumping source 1 is configured to produce pumping excitation energy directed through the high-reflectivity mirror 3 and into the laser media 5 along its corresponding optical path. The plurality of optical pumping sources 1 produces a pumping excitation energy, which substantially passes through the high-reflectivity mirror 3 and into the laser media 5. In response to the pumping excitation energy from the plurality of optical pumping sources 1, the laser media 5 emits atomic optical emissions in various directions. The atomic optical emissions emanating from the laser media 5 towards the one or more optical sources 1 will be substantially reflected by the high-reflectivity mirror 3. The atomic optical emissions emanating from the laser media 5 reaching the passive q-switch media 7 will be absorbed by the passive q-switch media 7 until the passive q-switch media 7 becomes substantially transparent to the atomic optical emissions. Once the passive q-switch media 7 becomes substantially transparent to the atomic optical emissions, the atomic optical emissions is focused by one of the plurality of output lenses, the first output lens 21, the second output lens 23, the third output lens 25 and the fourth output lens 27, preferably in a manner to produce one or more sparks.

The lasing energy, produced in the processes described above, is directed through an output lens from the plurality of output lenses, the first output lens 21, the second output lens 23, the third output lens 25 and the fourth output lens 27. The plurality of output lenses, the first output lens 21, the second output lens 23, the third output lens 25 and the fourth output lens 27 focuses the lasing energy, preferably one or more of the plurality of output lenses is focused down to a sufficiently small focal point generating a power density or photon flux density of about $1\times10^{11}$ W/cm$^2$ or greater so as to create a spark. The first output lens 21, the second output lens 23, the third output lens 25 and the fourth output lens 27 produces a corresponding first focal point 31, second focal point 33, third focal point 35, and fourth focal point 37. As emphasized by the third focal point 35 in FIG. 2, the focal points 35 are each at substantially different locations, including, but not limited to, different distances from the output coupler 9. This embodiment is preferred for engine combustion, particularly lean burning combustion, where the generation of multiple focal points, preferably one or more sparks, provides a more reliable ignition. Preferably, the optical pumping sources 1 are each configured to produce pumping excitation energy parallel to each other along the optical paths 13 from each optical pumping source passing through the high-reflectivity mirror 3 and into the laser media 5.

Figure 3:
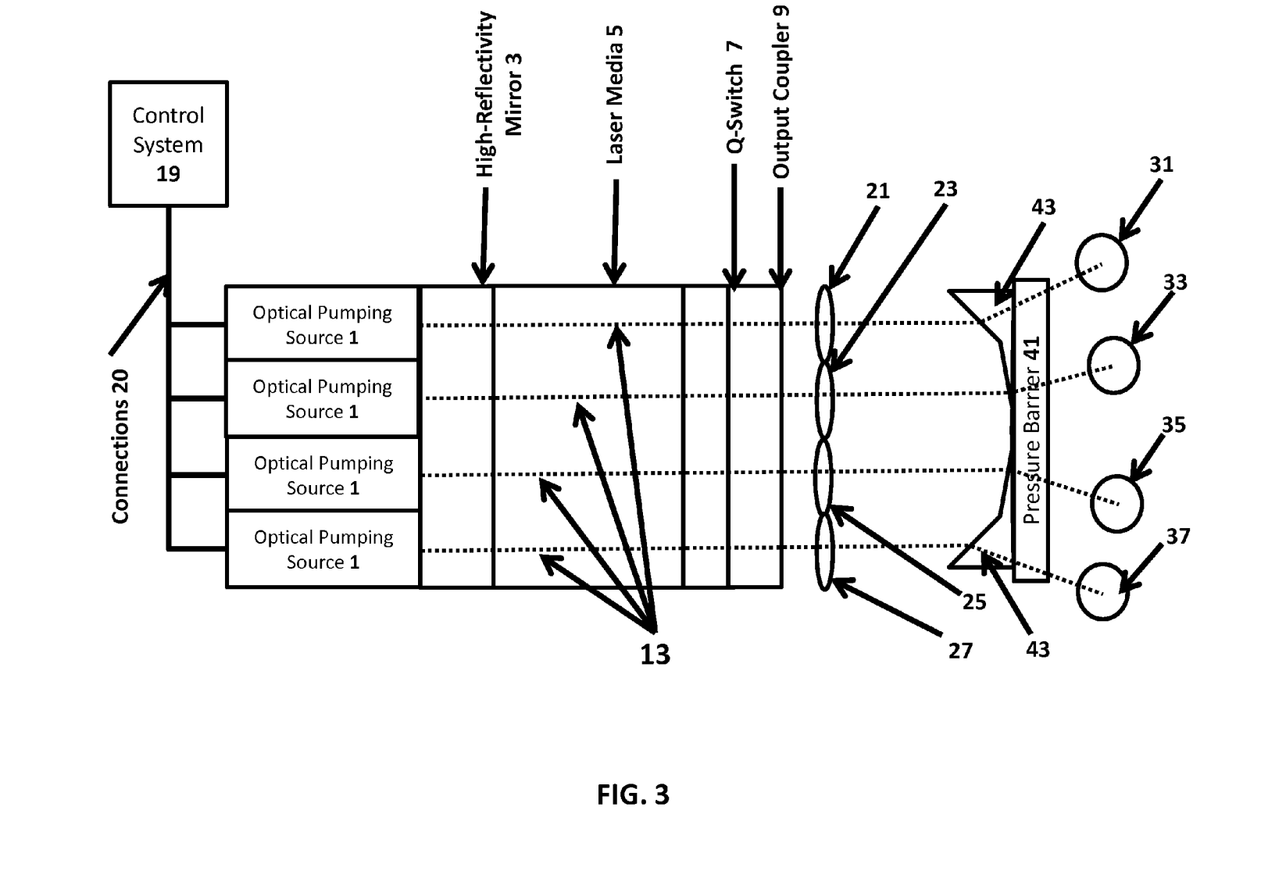
FIG. 3 depicts an overview of one embodiment of a multi-point laser device producing a plurality of lasing events focused to substantially different locations using one or more steering wedges positioned between output lenses and a pressure barrier.

FIG. 3

FIG. 3 depicts an overview of one embodiment of a multi-point laser device producing a plurality of lasing events focused to substantially different locations using one or more steering wedges positioned between output lenses and a pressure barrier. As shown in FIG. 3, and similar to FIG. 1 and FIG. 2, a high-reflectivity mirror 3, a laser media 5, a passive q-switch media 7, an output coupler 9 and one or more output lenses, which in this embodiment is a steering wedge or concave optic 43, positioned along an optical path corresponding to each optical pumping source 13. The plurality of optical pumping sources 1 produces a pumping excitation energy, which substantially passes through the high-reflectivity mirror 3 and into the laser media 5. In response to the pumping excitation energy from the plurality of optical pumping sources 1, the laser media 5 emits atomic optical emissions in various directions. The atomic optical emissions emanating from the laser media 5 towards the one or more optical sources 1 will be substantially reflected by the high-reflectivity mirror 3. The atomic optical emissions emanating from the laser media 5 reaching the passive q-switch media 7 will be absorbed by the passive q-switch media 7 until the passive q-switch media 7 becomes substantially transparent to the atomic optical emissions. Once the passive q-switch media 7 becomes substantially transparent to the atomic optical emissions, the atomic optical emissions is focused through one of the plurality of output lenses, steering wedge or concave optic 43, preferably in a manner to produce one or more sparks.

The lasing energy, produced in the processes described above, is directed through the steering wedge or concave optic 43. The steering wedge or concave optic 43 focuses the lasing energy, preferably to produce at least one sufficiently small focal point generating a power density or photon flux density of about $1\times10^{11}$ W/cm$^2$ or greater so as to create a spark. The steering wedge or concave optic 43 shown in FIG. 3 as one exemplary embodiment produces a first focal point 31, second focal point 33, third focal point 35, and fourth focal point 37. In the alternative, any number of focal points may be created. This embodiment is preferred for engine combustion, particularly lean burning combustion, where the generation of multiple focal points, preferably one or more sparks, provides a more reliable ignition.

Figure 4:
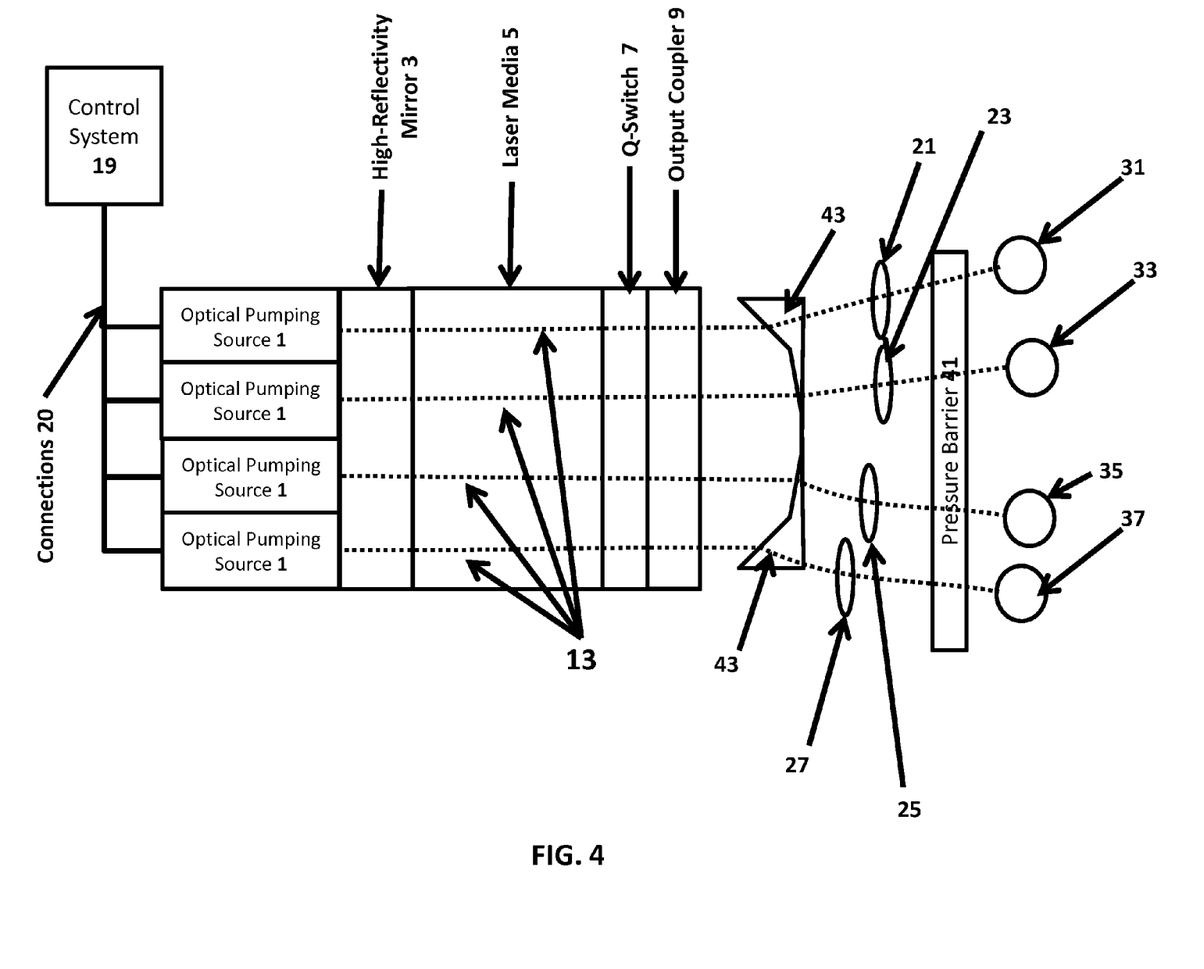
FIG. 4 depicts an overview of one embodiment of a multi-point laser device producing a plurality of lasing events focused to substantially different locations using one or more steering wedges positioned between an output coupler and output lenses.

FIG. 4

FIG. 4 depicts an overview of one embodiment of a multi-point laser device producing a plurality of lasing events focused to substantially different locations using one or more steering wedges positioned between the output coupler and the output lenses. The embodiment described in FIG. 4 is the same as the embodiment described above in FIG. 3, with the exception that the position of the plurality of output lenses (the first output lens 21, the second output lens 23, the third output lens 25 and the fourth output lens 27) is switched with that of the steering wedge or concave optic 43.

Figure 5:
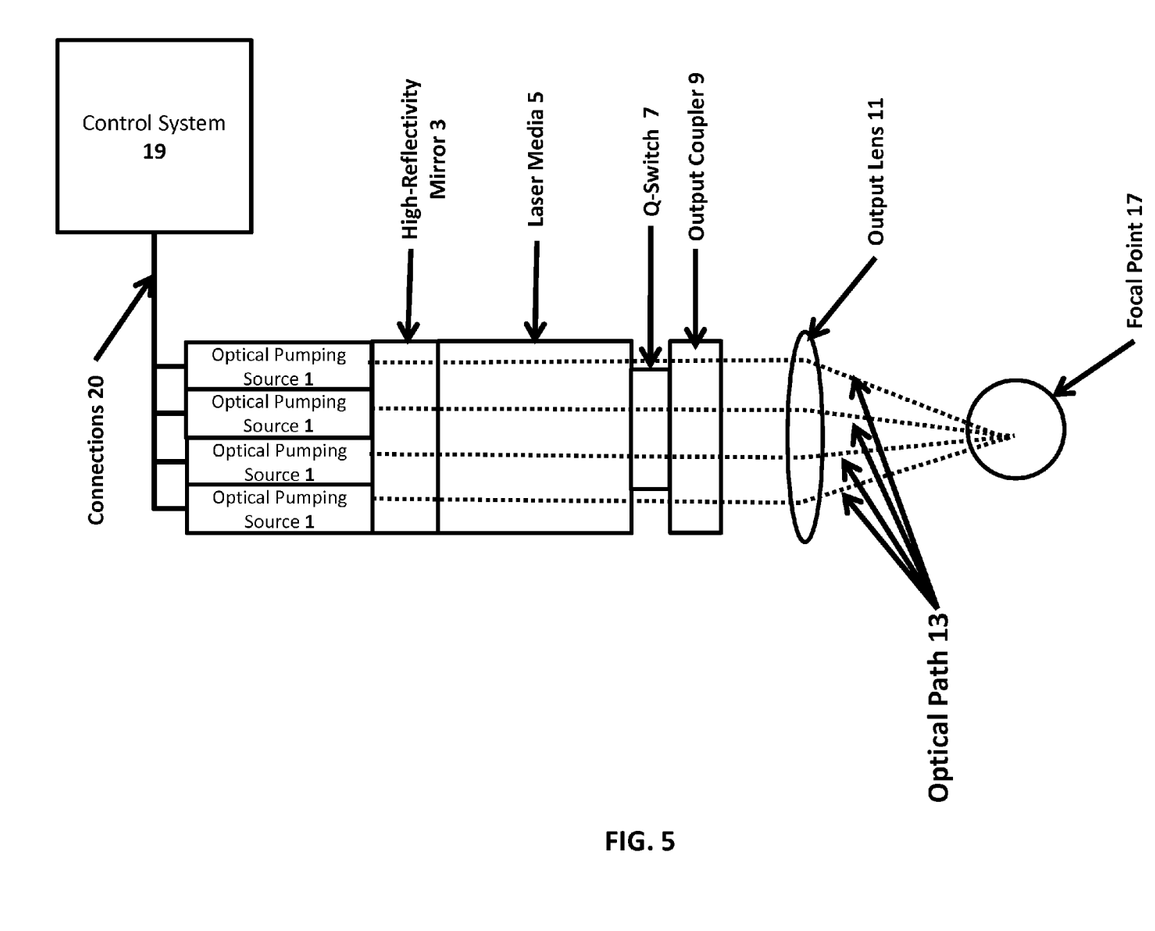
FIG. 5 depicts an overview of one embodiment of a multi-point laser device producing a plurality of lasing events at substantially different times focused to a single lasing location using a single output lens using a partial q-switch media.

FIG. 5

FIG. 5 depicts an overview of one embodiment of a multi-point laser device producing a plurality of lasing events at substantially different times focused to a single lasing location using a single output lens using a partial q-switch media. As shown in the embodiment of FIG. 5, and similar to FIG. 1, a high-reflectivity mirror 3, a laser media 5, a passive q-switch media 7, an output coupler 9 and an output lens from said one or more output lenses, which in this embodiment is a single output lens 11 are positioned along an optical path 13 corresponding to each optical pumping sources 1 and are as described above with the exception of the passive q-switch media 7. As described above, the single output lens 11 focuses the lasing energy into a focal point 17. A control system 19 is also preferably connected to and configured to control the plurality of optical pumping sources 1 via one or more connections 20, as described above.

In the embodiment depicted in FIG. 5, the passive q-switch media 7 passive q-switch media 7 is positioned along at least one, but not all of said optical paths 13, whereby a portion of pumping excitation energy and atomic optical emissions produced by the laser media may pass from the laser media to the output coupler 11 without passing through the passive q-switch media 7. This embodiment is preferred in some embodiments, as the optical paths 13 not passing through the passive q-switch media 7 will provide a continuous, but lower power, output unobstructed by the passive q-switch media 7. The continuous, but lower power, output is preferably used to prolong a spark or plasma production.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

All publications and patent documents cited in this application are incorporated by reference in their entirety for all purposes to the same extent as if each individual publication or patent document were so individually denoted.

Any element in a claim that does not explicitly state "means for" performing a specified function, or "step for" performing a specific function, is not to be interpreted as a "means" or "step" clause as specified in 35 U.S.C.§112, ¶6. In particular, the use of "step of" in the claims herein is not intended to invoke the provisions of 35 U.S.C.§112, ¶6.

The invention claimed is:

1. A multi-point laser device comprising:
   a) a plurality of optical pumping sources, a high-reflectivity mirror, a laser media, a passive q-switch media, an output coupler, and one or more output lenses;
   b) each said optical pumping source comprising a corresponding optical path;
   c) said high-reflectivity mirror, said laser media, said output coupler, an output lens from said one or more output lenses all positioned along each said optical path;
   d) said high-reflectivity mirror positioned between and optically connected to each said optical pumping source and said laser media along each said optical path;
   e) said laser media positioned between and optically connected to said high-reflectivity mirror and output coupler along each said optical path;
   f) said passive q-switch positioned between and optically connected to said laser media and said output coupler along at least one said optical path;
   g) said output coupler positioned between and optically connected to said laser media and an output lens from said one or more output lenses along each said optical path;
   h) each said optical pumping source creating a pumping excitation energy;
   i) said laser media made of a material that emits an atomic optical emission when exposed to said pumping excitation energy;
   j) said high-reflectivity mirror substantially reflective to said atomic optical emission of said laser media and substantially transparent to said pumping excitation energy; and whereby
   k) each optical pumping source creates a pumping excitation energy along a corresponding optical path directed through said high-reflectivity mirror and into said laser media at substantially different locations within the laser media thereby producing atomic optical emissions at substantially different locations within said laser media and directed along the corresponding optical path of the optical pumping source; said output coupler and one or more output lenses are configured to produce a plurality of lasing events at substantially different times, locations or a combination thereof from the multiple atomic optical emissions produced at substantially different locations within said laser media; and
   l) said laser media is a single continuous media.

2. The multi-point laser device of claim 1 whereby:
   a) said optical pumping sources comprises a plurality of VCSELs;
   b) said laser media is Nd:YAG; and
   c) said passive q-switch media is Cr:YAG.

3. The multi-point laser device of claim 1 whereby said optical pumping sources, said high-reflectivity mirror, said laser media, said passive q-switch media, said output coupler, and said one or more output lenses are configured to produce a plurality of lasing events at substantially different times, but substantially the same location.

4. The multi-point laser device of claim 1 whereby said optical pumping sources, said high-reflectivity mirror, said laser media, said passive q-switch media, said output coupler, and said one or more output lenses are configured to produce a plurality of lasing events at substantially the same time, but substantially different locations.

5. The multi-point laser device of claim 1 whereby said optical pumping sources, said high-reflectivity mirror, said laser media, said passive q-switch media, said output coupler, and said one or more output lenses are configured to produce a plurality of lasing events at both substantially different times and substantially different locations.

6. The multi-point laser device of claim 1 whereby said passive q-switch media is positioned though at least one, but not all of said optical paths, whereby a portion of pumping excitation energy and atomic optical emissions produced by the laser media may pass from the laser media to the output coupler without passing through the passive q-switch media.

7. The multi-point laser device of claim 1 whereby:
   a) said laser media is a single continuous media; and
   b) said high-reflectivity mirror is made of a material which is substantially transparent to said pumping energy and substantially reflective to the majority of said atomic optical emission.

8. The multi-point laser device of claim 3 whereby:
   a) said laser media is a single continuous media; and
   b) said high-reflectivity mirror is made of a material which is substantially transparent to said pumping energy and substantially reflective to the majority of said atomic optical emission.

9. The multi-point laser device of claim 8 further comprising:
   a) a control system connected to and configured to control said plurality of optical pumping sources; and whereby:
   b) the optical pumping sources are each configured to produce pumping excitation energy parallel to each other along the optical paths from each optical pumping source passing through the high-reflectivity mirror and into the laser media; and c) each optical pumping source is controlled individually by said control system.

10. The multi-point laser device of claim 9 whereby:
   a) substantially different times is at least a difference of 1,000 microseconds;
   b) substantially the same location is no further than 1 millimeter;
   c) said optical pumping sources comprises a plurality of VCSELs; and
   d) said laser media is Nd:YAG; and
   e) said passive q-switch media is Cr:YAG.

11. The multi-point laser device of claim 10 whereby said passive q-switch media is positioned along at least one, but not all of said optical paths, whereby a portion of pumping excitation energy and atomic optical emissions produced by the laser media may pass from the laser media to the output coupler without passing through the passive q-switch media.

12. The multi-point laser device of claim 10 whereby said passive q-switch media is positioned along each said optical paths.

13. The multi-point laser device of claim 4 whereby:
   a) said laser media is a single continuous media; and
   b) said high-reflectivity mirror is made of a material which is substantially transparent to said pumping energy and substantially reflective to the majority of said atomic optical emission.

14. The multi-point laser device of claim 13 further comprising:
   a) a control system connected to and configured to control said plurality of optical pumping sources; and whereby:
   b) the optical pumping sources are each configured to produce pumping excitation energy parallel to each other along the optical path from each optical pumping source passing through the high-reflectivity mirror and into the laser media; and
   c) each optical pumping source is controlled together in concert by said control system.

15. The multi-point laser device of claim 14 whereby:
   a) substantially the same time is a time closeness no more than 1,000 microseconds;
   b) substantially different locations is a distance separation of at least 1 millimeter;
   c) said optical pumping sources comprises a plurality of VCSELs; and
   d) said laser media is Nd:YAG; and
   e) said passive q-switch media is Cr:YAG.

16. The multi-point laser device of claim 5 whereby:
   a) said laser media is a single continuous media; and
   b) said high-reflectivity mirror is made of a material which is substantially transparent to said pumping energy and substantially reflective to the majority of said atomic optical emission.

17. The multi-point laser device of claim 16 further comprising:
   a) a control system connected to and configured to control said plurality of optical pumping sources; and whereby:
   b) the optical pumping sources are each configured to produce pumping excitation energy parallel to each other along the optical path from each optical pumping source passing through the high-reflectivity mirror and into the laser media; and
   c) each optical pumping source is controlled individually by said control system.

18. The multi-point laser device of claim 17 whereby:
   a) substantially different times is at least a difference of 1,000 microseconds;
   b) substantially different locations is a distance separation of at least 1 millimeter;
   c) said optical pumping sources comprises a plurality of VCSELs; and
   d) said laser media is Nd:YAG; and
   e) said passive q-switch media is Cr:YAG.

19. The multi-point laser device of claim 18 whereby said passive q-switch media is positioned along at least one, but not all of said optical paths, whereby a portion of pumping excitation energy and atomic optical emissions produced by the laser media may pass from the laser media to the output coupler without passing through the passive q-switch media.

20. The multi-point laser device of claim 18 whereby said passive q-switch media is positioned along each said optical paths.

* * * * *